(12) United States Patent
Sheehan et al.

(10) Patent No.: US 8,540,922 B2
(45) Date of Patent: Sep. 24, 2013

(54) LASER PATTERNING OF A CARBON NANOTUBE LAYER

(75) Inventors: Lynn Sheehan, Barndarrig (IE); Kevin Dooley, Blessington (IE); Rory Jordan, Dublin (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 1261 days.

(21) Appl. No.: 11/895,756

(22) Filed: Aug. 27, 2007

(65) Prior Publication Data

US 2009/0311489 A1    Dec. 17, 2009

(51) Int. Cl.
 *C01B 31/02* (2006.01)

(52) U.S. Cl.
 USPC .................. 264/400; 264/482; 264/430

(58) Field of Classification Search
 USPC ................................. 264/430, 482
 See application file for complete search history.

(56) References Cited

U.S. PATENT DOCUMENTS

| | | | |
|---|---|---|---|
| 4,678,889 A * | 7/1987 | Yamanaka | ............... 219/121.69 |
| 6,027,682 A | 2/2000 | Almquist et al. | |
| 6,200,646 B1 | 3/2001 | Neckers et al. | |
| 6,277,318 B1 | 8/2001 | Bower et al. | |
| 6,366,825 B1 | 4/2002 | Smalley et al. | |
| 7,029,751 B2 | 4/2006 | Fan et al. | |
| 7,052,594 B2 | 5/2006 | Pelrine et al. | |
| 7,064,474 B2 * | 6/2006 | Liu et al. | ....................... 313/309 |
| 7,115,981 B2 | 10/2006 | Grigg | |
| 7,221,515 B2 | 5/2007 | Kurt et al. | |
| 2002/0043711 A1 | 4/2002 | Akram et al. | |
| 2002/0149137 A1 | 10/2002 | Jang et al. | |
| 2003/0001312 A1 | 1/2003 | Nguyen et al. | |
| 2003/0129119 A1 | 7/2003 | Chiu et al. | |
| 2004/0175631 A1 | 9/2004 | Crocker et al. | |
| 2004/0240157 A1 | 12/2004 | Legagneux et al. | |
| 2005/0007002 A1 | 1/2005 | Golovchenko et al. | |
| 2005/0202350 A1 | 9/2005 | Colburn et al. | |
| 2005/0266162 A1 * | 12/2005 | Luo et al. | ....................... 427/180 |
| 2006/0003569 A1 | 1/2006 | Farnworth et al. | |
| 2006/0022323 A1 | 2/2006 | Swee Seng | |
| 2006/0022379 A1 | 2/2006 | Wicker et al. | |
| 2006/0057290 A1 | 3/2006 | Glatkowski | |
| 2006/0073089 A1 | 4/2006 | Ajayan et al. | |
| 2006/0078638 A1 | 4/2006 | Holmboe et al. | |
| 2006/0097430 A1 * | 5/2006 | Xiaochun et al. | ............. 264/400 |
| 2006/0098389 A1 | 5/2006 | Liu et al. | |
| 2006/0124028 A1 | 6/2006 | Huang et al. | |
| 2006/0134326 A1 | 6/2006 | Watanabe et al. | |

(Continued)

FOREIGN PATENT DOCUMENTS

| CN | 1501422 A | 6/2004 |
|---|---|---|
| KR | 1020040107000 | 12/2004 |

OTHER PUBLICATIONS

MicroChem, "Su-8 Resists", 2001, microchem.com.*

(Continued)

*Primary Examiner* — Yogendra Gupta
*Assistant Examiner* — Alison Hindenlang

(57) ABSTRACT

A method of patterning a carbon nanotube layer includes providing a substrate comprising a carbon nanotube layer. A laser beam is generated. The laser beam is directed onto a first surface of the carbon nanotube layer. Relative movement between the laser beam and the first surface is caused, thereby forming at least one cavity feature on the first surface.

18 Claims, 5 Drawing Sheets

(56) References Cited

U.S. PATENT DOCUMENTS

| | | |
|---|---|---|
| 2006/0192312 A1 | 8/2006 | Wahlstrom |
| 2006/0240189 A1 | 10/2006 | Ger et al. |
| 2007/0003471 A1 | 1/2007 | Kawabata |
| 2007/0029706 A1 | 2/2007 | Ueno |
| 2007/0114885 A1 | 5/2007 | Benslimane et al. |
| 2007/0144431 A1 | 6/2007 | Lin |
| 2007/0153353 A1 | 7/2007 | Gruner |
| 2007/0153363 A1 | 7/2007 | Gruner |
| 2007/0160758 A1 | 7/2007 | Roach |
| 2007/0164651 A1 | 7/2007 | Fu et al. |

OTHER PUBLICATIONS

S. Iijima, "Helical Microtubules of Graphitic Carbon," Letters to Nature, vol. 354, Nov. 7, 1991 (pp. 56-58).

K.L. Lu et al., "Mechanical Damage of Carbon Nanotubes by Ultrasound," Apr. 15, 1996; (pp. 814-816).

M.J. O'Connell et al., "Band Gap Fluorescence from Individual Single-Walled Carbon Nanotubes," Science Magazine, vol. 297, Jul. 26, 2002 (pp. 593-596).

M.S. Strano et al., "Electronic Structure Control of Single-Walled Carbon Nanotube Functionalization," Science Magazine, vol. 301, Sep. 12, 2003 (pp. 1519-1522).

M.S. Strano et al., "The Role of Surfactant Adsorption During Ultrasonication in . . . Nanotubes," Journal of Nanoscience and Nanotechnology, vol. 3, No. 1/2, 2003 (pp. 81-86).

K. Kamaras et al., "Covalent Bond Formation to a Carbon Nanotube Metal," Science Magazine, vol. 301, Sep. 12, 2003 (p. 1501).

Z. Wu et al., "Transparent, Conductive Carbon Nanotube Films," Science Magazine, vol. 305, Aug. 27, 2004; (pp. 1273-1276).

C.M. Trottier et al., "Properties and Characterization of Carbon-Nanotube-Based Transparent Conductive Coating," Journal of the SID 13/9, 2005 (pp. 759-763).

G. Gruner, "Carbon Nanotube Films for Transparent and Plastic Electronics," J. Mater. Chem., 2006, (pp. 3533-3539).

F.C. Cheong et al., "Large Area Patterned Arrays of Aligned Carbon Nanotubes via Laser Trimming," Institute of Physics Publishing; Nanotechnology 14 (2003), pp. 433-437.

S. McGinty et al., "UV Laser Induced Creation of Self-Raised Surfaces in Linear Low Density Polyethylene (LLDPE)," . . . Third Int'l WLT-Conf. on Lasers in Mfging, 2005, 6 pgs.

Carbon Nanotechnologies, Inc. webpage available at http://www.cnanotech.com., Accessed Aug. 27, 2007.

Eikos webpage available at http://www.eikos.com., Accessed Aug. 27, 2007.

\* cited by examiner

LASER PATTERNING OF A CARBON NANOTUBE LAYER

BACKGROUND

Since their discovery in 1991, carbon nanotubes (CNTs) have attracted considerable attention from researchers because of their unique electrical, mechanical, and thermal properties. The remarkable electrical properties of carbon nanotubes make them ideal candidates for applications such as sensors, interconnects, transistors, and flat panel displays. These properties provide an opportunity to develop high performance flexible, transparent electrodes for use in various products. However, for successful implementation into products such as flexible electronics, it is desirable to have methods to deposit and pattern carbon nanotubes over large areas, at high resolution, and with processing temperatures that are compatible with plastics. In order to take advantage of the potential electrical and optical properties of carbon nanotubes, manufacturers will have to be able to pattern the materials into common electronic circuitry forms.

Inkjet printing of carbon nanotubes directly onto a substrate in a desired pattern has been previously proposed. However, such a process has the disadvantages of ink formulation for the carbon nanotubes, resolution limitations, and insufficient attachment to the substrates. Patterning techniques based on substrate and carbon nanotube chemistry interactions have also been previously proposed. This process has the disadvantages of very complicated chemical science, inconsistent results for pattern fill, and the need to pattern the attach chemical prior to attaching the carbon nanotubes. Photolithographic processes have also been proposed. Such processes have the disadvantage of requiring several photolithographic and plasma etch steps to complete the desired pattern. Another proposal is to use laser trimming of carbon nanotubes using a copper mask system. This laser trimming method can produce patterns of carbon nanotubes defined by the copper grid mask. This method has the disadvantages that only patterns defined by the copper grid can be produced, and the laser exposure needs to be uniform over the area being patterned.

SUMMARY

One embodiment provides a method of patterning a carbon nanotube layer. The method includes providing a substrate comprising a carbon nanotube layer. A laser beam is generated. The laser beam is directed onto a first surface of the carbon nanotube layer. Relative movement between the laser beam and the first surface is caused, thereby forming at least one cavity feature on the first surface.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," etc., may be used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
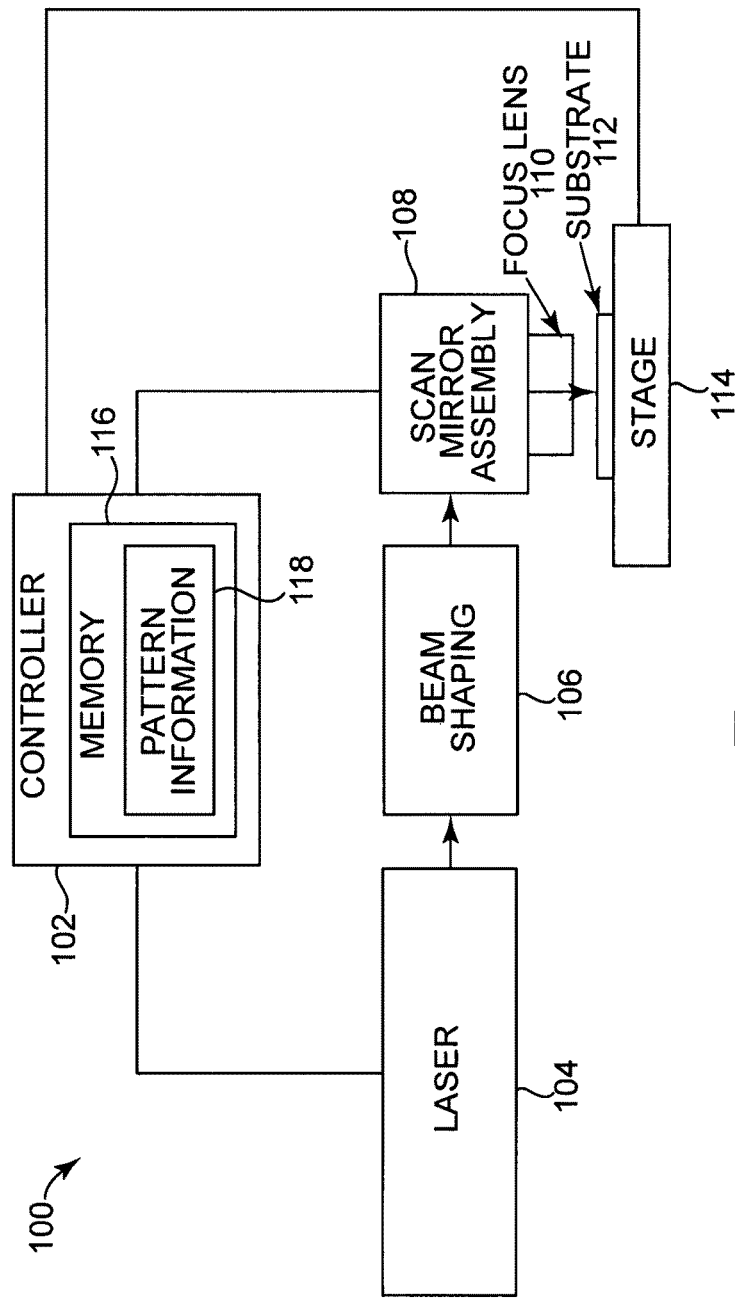
FIG. 1 is a block diagram illustrating a system for patterning a carbon nanotube layer according to one embodiment.

FIG. 1 is a block diagram illustrating a system 100 for patterning a substrate 112 according to one embodiment. System 100 includes controller 102, laser 104, beam shaping assembly 106, scan mirror assembly 108, focus lens 110, and stage 114. The substrate 112 to be patterned is placed on stage 114. Controller 102 causes laser 104 to generate a laser beam, which is output to beam shaping assembly 106. Beam shaping assembly 106 shapes the received laser beam, and outputs a shaped laser beam to scan mirror assembly 108. Controller 102 causes scan mirror assembly 108 to scan the received laser beam across the substrate 112 in a desired pattern. Prior to hitting the substrate 112, the laser beam is focused onto the substrate 112 by focus lens 110. In one embodiment, the focus lens 110 focuses the laser beam to a 1 to 100 micrometer diameter spot on the substrate 112. The diameter of the laser spot is dependent on the focus lens 110 that is used. In one specific embodiment, the focus lens 110 is configured to focus the laser beam to a 10 micrometer diameter spot on the substrate 112.

In one embodiment, scan mirror assembly 108 scans the laser beam across the substrate 112 in two dimensions (e.g., X and Y dimensions parallel to the plane of the substrate 112), thereby allowing two-dimensional patterns to be traced out on the substrate 112. In one embodiment, controller 102 is also configured to cause movement of stage 114, which allows the system 100 to scan the laser beam over larger substrates 112. In another embodiment, the scan mirror assembly 108 is held in a fixed position or is not used, and relative movement between the laser beam and the substrate 112 is caused solely by movement of the stage 114. In yet another embodiment, system 100 is configured to provide vertical movement (e.g., movement in a Z dimension perpendicular to the plane of the substrate 112) between the stage 114 and the optics (e.g., scan mirror assembly 108 and focus lens 110).

In one embodiment, substrate 112 comprises a carbon nanotube film layer. In one embodiment, the carbon nanotube layer is a pure or substantially pure carbon nanotube mat that is deposited as an interacting network that utilizes the collective properties of carbon nanotubes. Carbon nanotubes are transparent when in thin film form and this, coupled with their inherent flexibility, make them suitable for use in transparent flexible electronics. In order to harness the electronic properties of patterned conductors, in one embodiment, the strong interactions between nanotubes are overcome, and the nanotubes are debundled into individual tubes prior to film deposition. In one embodiment, this debundling process is achieved by processing the carbon nanotubes into a dispersion. Mechanical and/or chemical treatments may be used to achieve stable debundled solutions. In one embodiment, nanotubes are processed into a dispersion in order to achieve individual tubes using mechanical debundling with the aid of a surfactant in a dispersion. A sonication tip is used to debundle the carbon nanotubes.

The carbon nanotube film to be patterned is then produced by filtering a fixed quantity of the dispersion through a nitrocellulose membrane. After the film is set, the surfactant is removed via solvent washing. The membrane containing the nanotube film is then transferred to a substrate, and dried for 2 hours at 90° C. The membrane is removed by dissolving the membrane in a suitable solvent, such as acetone. A number of solvent baths may be performed to ensure that the membrane is totally removed. This process results in a carbon nanotube film on a substrate, which can then be patterned into desired features. The thickness of the nanotube film can be controlled by changing the concentration of tubes in the solution.

The above-described process for forming a carbon nanotube film on a substrate is referred to herein as a vacuum filtration process. In another embodiment, a carbon nanotube film is deposited on a substrate by an inkjet process, spray coating, or gravure coating. In one embodiment, substrate 112 is a 6 inch diameter, 9 inch diameter, or A4 size substrate. In another embodiment, substrate 112 is a continuous substrate (e.g., for roll to roll processing).

In one embodiment, laser 104 is an 11 W diode pumped solid state pulsed ultraviolet (UV) laser operating at 60 kHz. Laser 104 generates UV laser light with a wavelength of less than 400 nm, and the wavelength is tied to energies that are equal to or higher than the bond energy of the material to be patterned. In one specific embodiment, laser 104 generates UV laser light with a wavelength of 355 nm and a pulse length of about 40 nanoseconds. The energy of the laser beam generated by laser 104 is controlled by controller 102 by changing the laser current. The interaction between the carbon nanotube layer in substrate 112 and the pulsed UV radiation results in the dissociation of certain chemical bonds in the carbon nanotube molecules, fragmenting it into smaller units. Above a specific threshold energy, carbon nanotube fragments are ablated from the surface of substrate 112. The amount of material that is ablated increases with increasing laser power.

In the illustrated embodiment, controller 102 includes memory 116 for storing pattern information 118, which defines the pattern that controller 102 causes the laser beam to trace out on the substrate 112. In one embodiment, the pattern information 118 also includes laser power information, which defines the laser power that is to be used at the various points in the pattern followed by the laser beam. Based on the stored pattern information 118, controller 102 is configured to cause system 100 to scan the laser beam over the substrate 112 in any desired pattern, and form cavity features (e.g., channels or microchannels) in the substrate 112 in a single process step by modifying the laser power above and below the ablation threshold while scanning the laser beam across the substrate 112. The laser patterning performed by system 100 according to one embodiment provides a reduction in process steps, compared to conventional photolithographic processes, as it provides for the patterning of features in carbon nanotube films without the need for photo-masks and the associated develop processes. In one embodiment, system 100 is configured to automatically pattern a carbon nanotube film into functional conductive structures, such as flexible, transparent, conductive traces, wires, and electrodes, with widths of less than one micrometer.

Figure 2A:
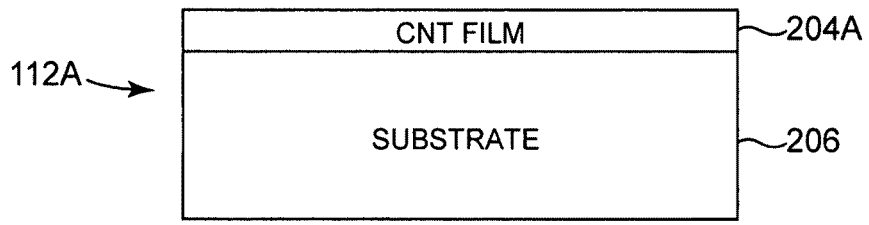
FIGS. 2A-2D are diagrams illustrating cross-sectional views of a substrate patterned by the system shown in FIG. 1 according to one embodiment.
Figure 2B:
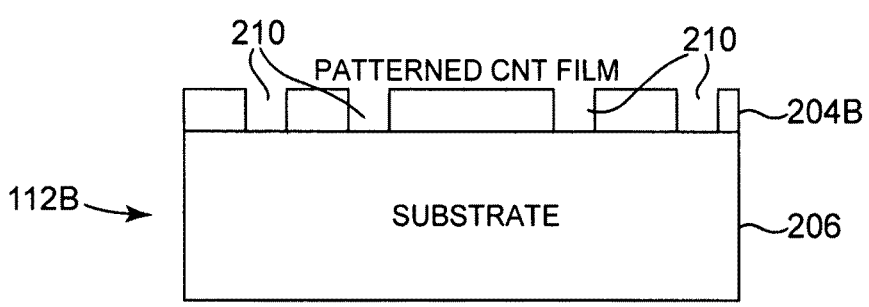

FIGS. 2A-2D are diagrams illustrating cross-sectional views of substrate 112 patterned by the system 100 shown in FIG. 1 according to one embodiment. The substrate 112A shown in FIG. 2A represents an example substrate 112 prior to patterning by system 100. As shown in FIG. 2A, substrate 112A includes a carbon nanotube film layer 204A formed on a substrate layer 206. In one embodiment, carbon nanotube film layer 204A is a transparent layer and has a thickness of less than one micrometer. In other embodiments, carbon nanotube film layer 204A is thicker than one micrometer, and may or may not be transparent. In one embodiment, substrate layer 206 is a silicon substrate, glass substrate, or polymer substrate. When the power of the laser 104 is increased above the ablation threshold of carbon nanotube layer 204A, material is ablated from the surface of carbon nanotube layer 204A, resulting in channels or cavities 210 being formed in the carbon nanotube layer 204A, as shown in substrate 112B of FIG. 2B. The ablation of the carbon nanotube material transforms the layer 204A into a patterned carbon nanotube film layer 204B. In the embodiment illustrated in FIG. 2B, the power of the laser 104 is sufficient to cause all of the carbon nanotube material at the target locations to be ablated, resulting in channels or cavities 210 being formed in the carbon nanotube layer that extend all the way down to the substrate layer 206.

Figure 2C:
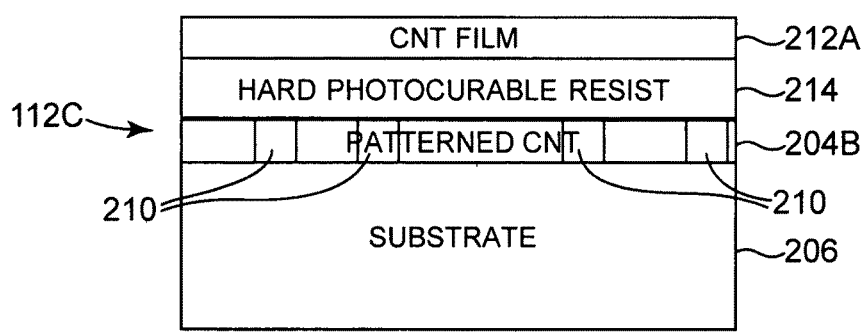

FIG. 2C shows a substrate 112C, which represents the substrate 112B after the formation of a hard photocurable resist layer 214 on the patterned carbon nanotube film layer 204B, and the formation of a second carbon nanotube film layer 212A on the resist layer 214. In one embodiment, the resist layer 214 is a cured, cross-linked polymer, such as SU8. SU8 is a negative photoresist material. Uncured SU8 can be in liquid or dry film form. Liquid SU8 is coated onto a substrate by spin, spray, or gravure coating. A dry SU8 film can be laminated onto a substrate. SU8 is typically cured using both UV and thermal curing steps. Cured SU8 is a hardened cross-linked polymer, and has a higher mechanical and thermal stability compared to linear polymers.

Figure 2D:
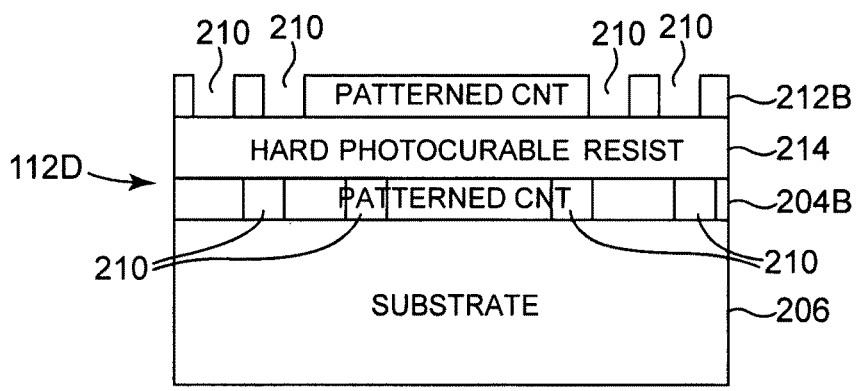

When the power of the laser 104 is increased above the ablation threshold of carbon nanotube layer 212A, material is ablated from the surface of carbon nanotube layer 212A, resulting in channels or cavities 210 being formed in the carbon nanotube layer 212A, as shown in substrate 112D of FIG. 2D. The ablation of the carbon nanotube material transforms the layer 212A into a patterned carbon nanotube film layer 212B. In the embodiment illustrated in FIG. 2D, the power of the laser 104 is sufficient to cause all of the carbon nanotube material at the target locations to be ablated, resulting in channels or cavities 210 being formed in the carbon nanotube layer that extend all the way down to the resist layer 214.

Figure 3A:
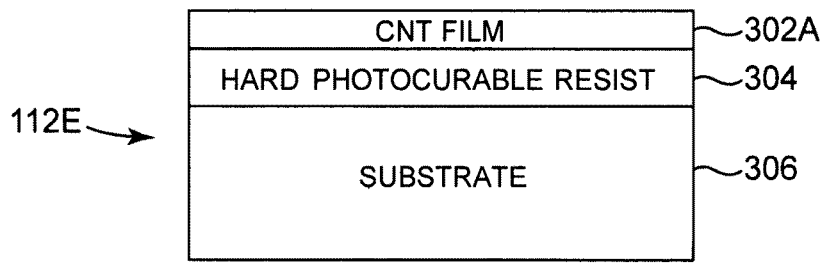
FIGS. 3A-3D are diagrams illustrating cross-sectional views of a substrate patterned by the system shown in FIG. 1 according to another embodiment.

FIGS. 3A-3D are diagrams illustrating cross-sectional views of substrate 112 patterned by the system 100 shown in FIG. 1 according to another embodiment. The substrate 112E shown in FIG. 3A represents an example substrate 112 prior to patterning by system 100. As shown in FIG. 3A, substrate 112E includes a carbon nanotube film layer 302A, a hard photocurable resist layer 304, and a substrate layer 306. Carbon nanotube film layer 302A is formed on resist layer 304, and resist layer 304 is formed on substrate layer 306. In one embodiment, carbon nanotube film layer 302A is a transparent layer and has a thickness of less than one micrometer. In other embodiments, carbon nanotube film layer 302A is thicker than one micrometer, and may or may not be transparent. In one embodiment, the resist layer 304 is a non-conductive, cured, cross-linked polymer, such as SU8. In one embodiment, substrate layer 306 is a silicon substrate, glass substrate, or polymer substrate.

Figure 3B:
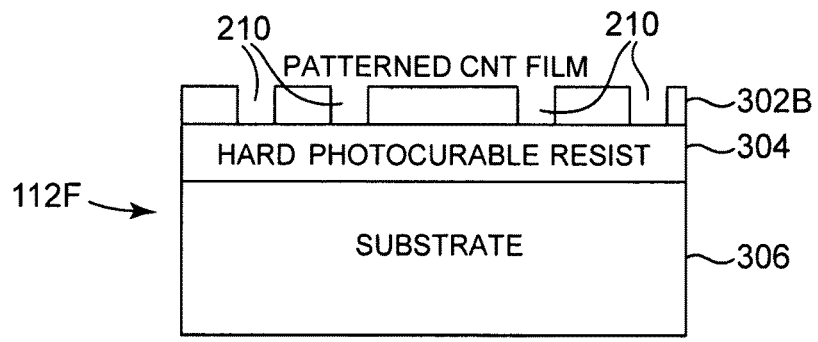

When the power of the laser 104 is increased above the ablation threshold of carbon nanotube layer 302A, material is ablated from the surface of carbon nanotube layer 302A, resulting in channels or cavities 210 being formed in the carbon nanotube layer 302A, as shown in substrate 112F of FIG. 3B. The ablation of the carbon nanotube material transforms the layer 302A into a patterned carbon nanotube film layer 302B. In the embodiment illustrated in FIG. 3B, the power of the laser 104 is sufficient to cause all of the carbon nanotube material at the target locations to be ablated, resulting in channels or cavities 210 being formed in the carbon nanotube layer that extend all the way down to the resist layer 304.

Figure 3C:
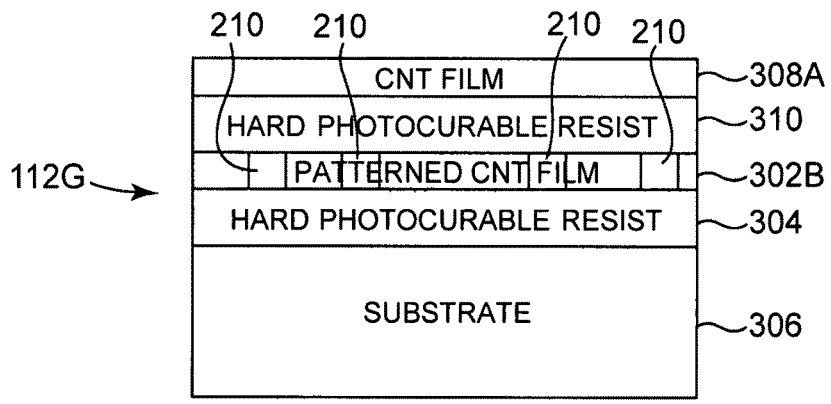
Figure 3D:
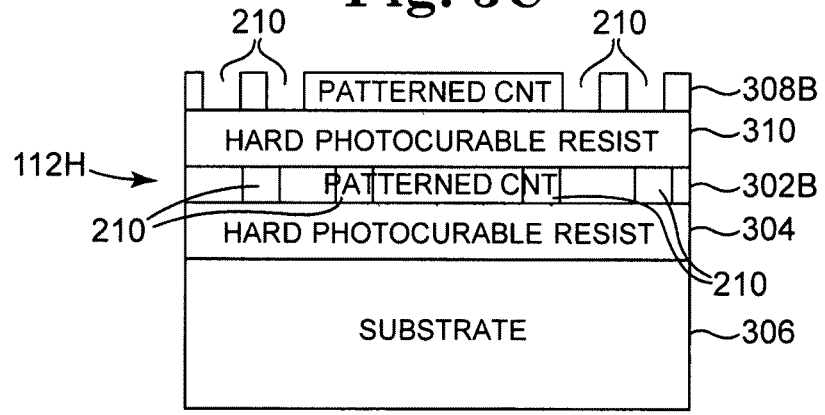

FIG. 3C shows a substrate 112G, which represents the substrate 112F after the formation of a second hard photocurable resist layer 310 on the patterned carbon nanotube film layer 302B, and the formation of a second carbon nanotube film layer 308A on the resist layer 310. In one embodiment, the resist layer 310 is a non-conductive, cured, cross-linked polymer, such as SU8. When the power of the laser 104 is increased above the ablation threshold of carbon nanotube layer 308A, material is ablated from the surface of carbon nanotube layer 308A, resulting in channels or cavities 210 being formed in the carbon nanotube layer 308A, as shown in substrate 112H of FIG. 3D. The ablation of the carbon nanotube material transforms the layer 308A into a patterned carbon nanotube film layer 308B. In the embodiment illustrated in FIG. 3D, the power of the laser 104 is sufficient to cause all of the carbon nanotube material at the target locations to be ablated, resulting in channels or cavities 210 being formed in the carbon nanotube layer that extend all the way down to the resist layer 310.

Figure 4:
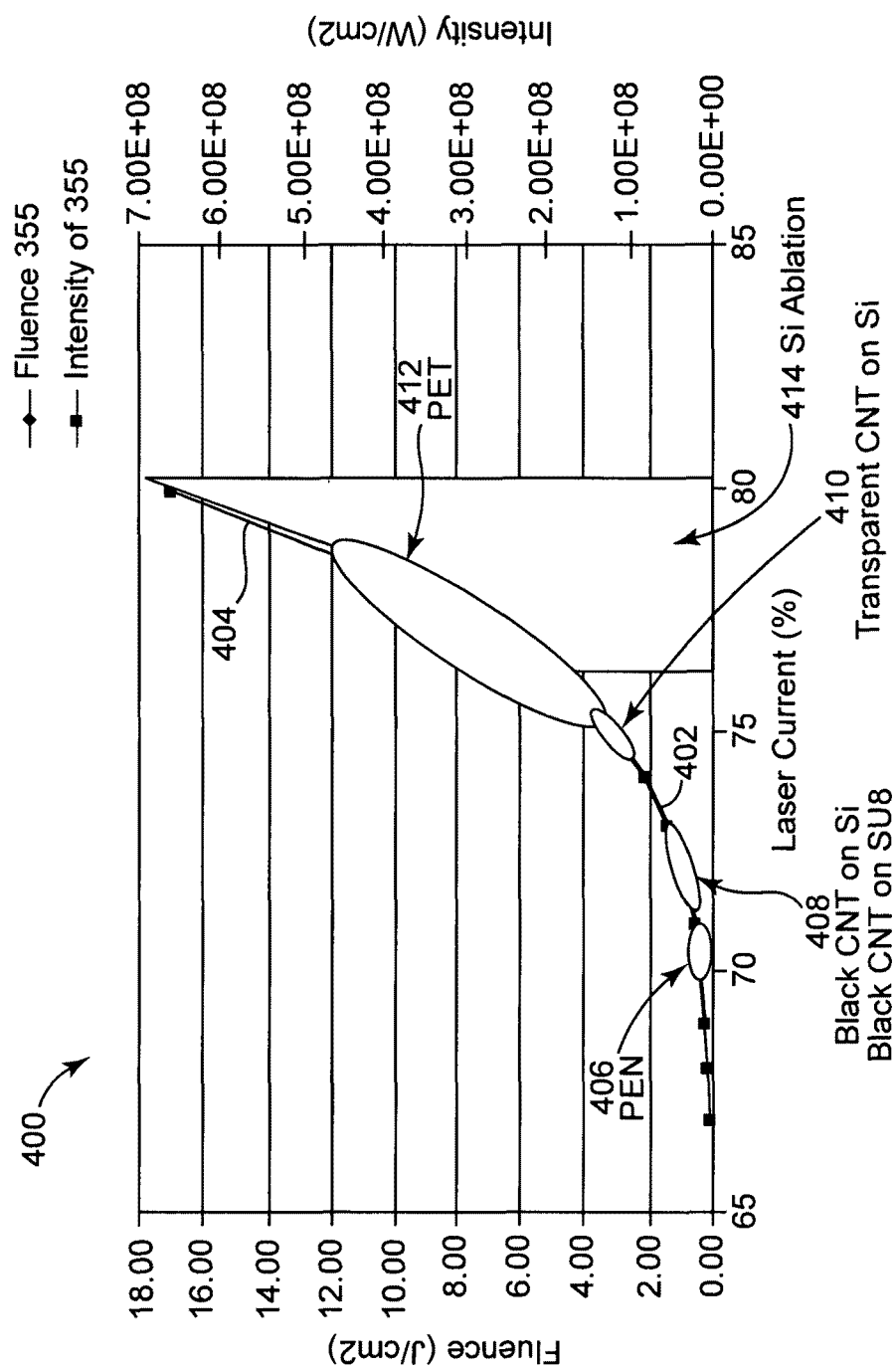
FIG. 4 is a graph showing the relationship between laser current and the ablation of various types of layers according to one embodiment.

FIG. 4 is a graph 400 showing the relationship between laser current of laser 104 and the ablation of various types of layers according to one embodiment. Graph 400 represents results obtained for a laser 104 operated at 60 kHz and providing UV light at 355 nm. The left vertical axis in graph 400 represents laser fluence in $J/cm^2$ of laser 104, the right vertical axis represents laser intensity in $W/cm^2$, and the horizontal axis represents laser current of laser 104 as a percentage of the maximum laser current of the laser 104. The fluence of laser 104 is represented by curve 402, and the intensity of laser 104 is represented by curve 404. Curves 402 and 404 are substantially overlapping.

The ablation threshold of a carbon nanotube layer is dependent on the thickness of the layer. Thicker carbon nanotube layers have a black appearance and are also referred to herein as black carbon nanotube layers. Thinner carbon nanotube layers have a transparent or substantially transparent appearance, and are also referred to herein as transparent carbon nanotube layers. It has been determined that the laser intensity needed for ablating thick carbon nanotube layers is a factor of two less than for thin transparent carbon nanotube layers.

As shown in FIG. 4, ablation of a black carbon nanotube layer occurs at a range 408 of about 71 to 73 percent of the maximum current of laser 104. Ablation range 408 represents experimental results obtained for black carbon nanotube layers formed on silicon substrates, as well as black carbon nanotube layers formed on SU8 substrates. Ablation of a thin transparent carbon nanotube layer occurs at a range 410 of about 74 to 76 percent of the maximum current of laser 104. Ablation range 410 represents experimental results obtained for a thin transparent carbon nanotube layers formed on silicon substrates. Within a given ablation range 408 or 410, as the laser power is increased, the resulting channels or cavities formed in the carbon nanotube layer become deeper and deeper. The penetration depth is also dependent on the laser wavelength and the absorption of the material being ablated. The higher the absorption coefficient of the material being ablated, the less penetration depth at a given wavelength. Thus, there is a tradeoff between ablation efficiency and wavelength, which is material dependent.

Also shown in FIG. 4 are a polyethylene naphthalene dicarboxylate (PEN) ablation range 406, a polyethylene terephthalate (PET) ablation range 412, and a silicon ablation range 414. PET and PEN are flexible substrate materials for transparent applications. Since the ablation ranges 412 and 414 are higher than the ablation ranges 408 and 410 for the carbon nanotube layer, when a carbon nanotube layer is formed on an underlying silicon layer or on an underlying PET layer, the carbon nanotube layer may be patterned without adversely affecting the underlying silicon or PET layer. By controlling the laser power and cut speed (i.e., the speed at which the laser beam is scanned across the substrate 112), the carbon nanotube layer can be patterned without damaging such an underlying silicon or PET layer. In contrast, ablation ranges 408 and 410 are higher than the PEN ablation range 406, which indicates that PEN may not be a suitable underlying substrate for a carbon nanotube layer to be patterned. Although some example underlying materials have been mentioned herein, it will be understood that the carbon nanotube layer can be patterned on any underlying material with an ablation threshold that is greater than the carbon nanotube layer.

Figure 5:
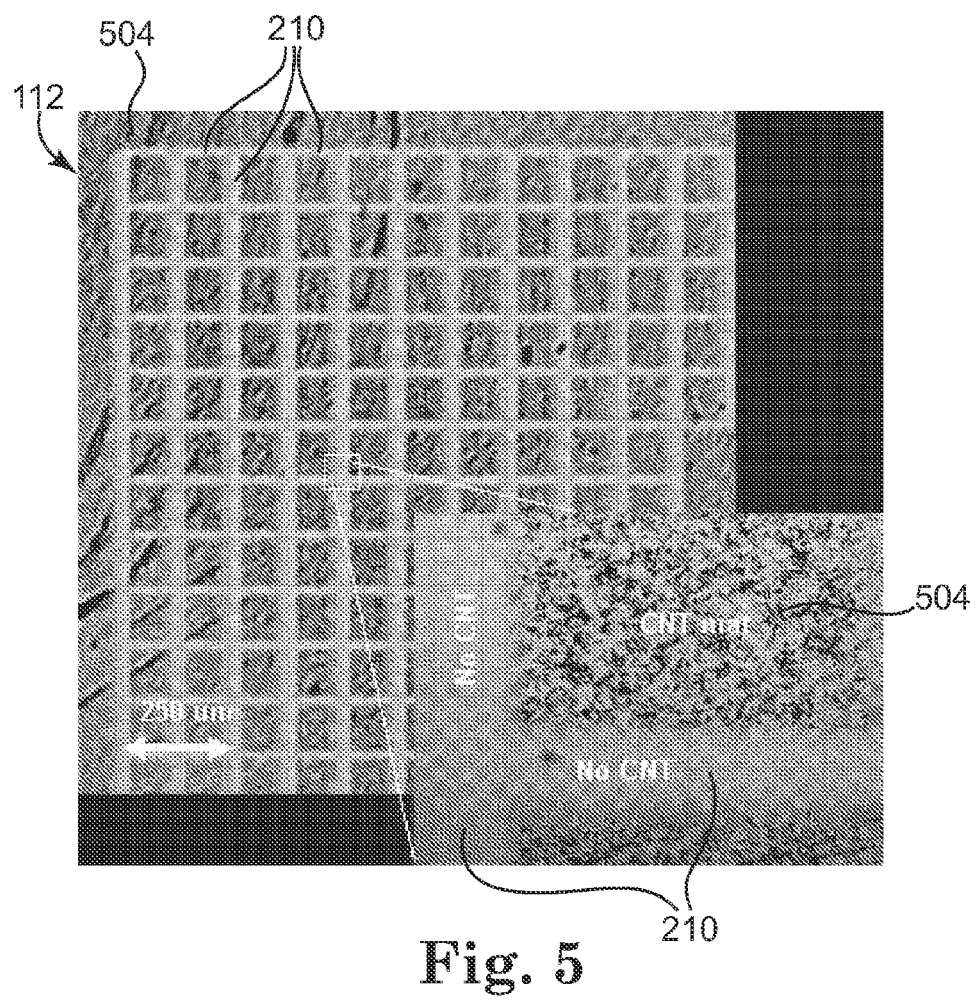
FIG. 5 is an optical microscope image of a substrate including a carbon nanotube layer with cavity features formed by the system shown in FIG. 1 according to one embodiment.

FIG. 5 is an optical microscope image of a substrate 112 including a carbon nanotube layer 504 with cavity features 210 formed by the system 100 shown in FIG. 1 according to one embodiment. In the embodiment illustrated in FIG. 5, the carbon nanotube layer 504 was formed on and patterned on an underlying silicon substrate. The cavity features 210 are formed by using laser energies at or above the ablation threshold of the carbon nanotube layer 504. In the illustrated embodiment, the cavity features 210 are microchannels or microtrenches that form a grid pattern in the carbon nanotube layer 504. In the embodiment shown in FIG. 5, carbon nanotube material has been completely removed in any area the laser light was incident, which thereby exposes the top surface of the underlying silicon layer in these areas. The complete removal of carbon nanotube material from the host substrate in the cavity regions 210 has also been confirmed by scanning electron micrograph (SEM) imaging, as well as by Raman spectroscopy. In one embodiment, system 100 is configured to create cavity features 210 in a carbon nanotube layer that are about 0.5 to 50 micrometers wide (i.e., line width) and about zero to several hundred micrometers deep.

One embodiment provides a system and method for direct write patterning of carbon nanotube thin films for flexible, transparent, electronics applications using laser ablation. The system and method according to one embodiment provides for large area, high resolution, patterning of carbon nanotube films. In contrast to other methods, such as methods that perform laser trimming using a grid mask, the method according to one embodiment provides for more flexible patterning of a very large carbon nanotube area, with any desired pattern that is programmed in, and the laser intensity can also be varied over the pattern, allowing for very flexible processing. The patterning method according to one embodiment is also more efficient than other methods, such as photolithographic processes, since the patterning may be accomplished in one process step as opposed to multi-step photolithographic processes. The patterning method according to one embodiment is compatible with low temperature (e.g., less than 150° C.) processing requirements, thereby enabling patterning on plastic substrates used for flexible substrate applications. The patterning method according to one embodiment is also maskless, and is scalable to meter class scales. The patterning method according to one embodiment is also capable of implementation on roll to roll type processing.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of patterning a carbon nanotube layer, the method comprising:
   providing a substrate comprising a carbon nanotube layer formed on a substrate layer;
   generating a laser beam;
   directing the laser beam onto a first surface of the carbon nanotube layer; and
   causing relative movement between the laser beam and the first surface to selectively remove a portion of the carbon nanotube layer during the relative movement without damaging the substrate layer, thereby forming at least one cavity feature on the first surface.

2. The method of claim 1, wherein the carbon nanotube layer is substantially transparent.

3. The method of claim 1, wherein the carbon nanotube layer is less than about 1 micrometer thick.

4. The method of claim 1, wherein the substrate comprises a carbon nanotube layer formed on the substrate layer by one of a vacuum filtration process, an inkjet process, a spray coating process, or a gravure coating process.

5. The method of claim 1, and further comprising:
   modifying a power of the laser beam to below a threshold value during the relative movement to prevent ablation of the carbon nanotube layer; and
   modifying a power of the laser beam to above the threshold value during the relative movement to cause ablation of the carbon nanotube layer and form the at least one cavity feature.

6. The method of claim 1, wherein the relative movement is caused by a scanning mirror that scans the laser beam across the first surface.

7. The method of claim 1, wherein the relative movement is caused by a scanning mirror that scans the laser beam across the first surface, and a moving stage that moves the substrate.

8. The method of claim 1, wherein the laser beam comprises ultraviolet light.

9. The method of claim 8, wherein the laser beam has a wavelength of 355nm.

10. The method of claim 1, wherein the laser beam is pulsed at 60kHz.

11. The method of claim 1, and further comprising:
    focusing the laser beam to a 1 to 100 micrometer diameter spot on the first surface.

12. The method of claim 1, wherein the substrate layer comprises one of silicon, glass, and plastic.

13. The method of claim 1, wherein the substrate layer comprises polyethylene terephthalate (PET).

14. The method of claim 1, wherein the substrate layer comprises a hard photocurable resist layer.

15. The method of claim 14, wherein the resist layer comprises a cured SU8 negative photoresist material.

16. The method of claim 1, wherein the substrate layer comprises a multi-layer stack.

17. The method of claim 16, wherein the multi-layer stack includes a patterned carbon nanotube layer.

18. The method of claim 1, wherein the at least one cavity extends from the first surface to a bottom surface of the carbon nanotube layer.

* * * * *

UNITED STATES PATENT AND TRADEMARK OFFICE
CERTIFICATE OF CORRECTION

PATENT NO. : 8,540,922 B2  
APPLICATION NO. : 11/895756  
DATED : September 24, 2013  
INVENTOR(S) : Lynn Sheehan et al.

Page 1 of 1

It is certified that error appears in the above-identified patent and that said Letters Patent is hereby corrected as shown below:

In the Claims

In column 8, line 1, in Claim 5, delete "claim l," and insert -- claim 1, --, therefor.

Signed and Sealed this  
Third Day of December, 2013

Margaret A. Focarino  
*Commissioner for Patents of the United States Patent and Trademark Office*